(12) United States Patent
Kim et al.

(10) Patent No.: US 9,660,011 B2
(45) Date of Patent: May 23, 2017

(54) ORGANIC LIGHT EMITTING DIODE DISPLAY DEVICE AND MANUFACTURING METHOD THEREOF

(71) Applicant: SAMSUNG DISPLAY CO., LTD., Yongin, Gyeonggi-Do (KR)

(72) Inventors: Deuk Jong Kim, Yongin (KR); Won Mo Park, Seongnam-si (KR); Yong Ho Yang, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 69 days.

(21) Appl. No.: 14/700,355

(22) Filed: Apr. 30, 2015

(65) Prior Publication Data

US 2016/0104757 A1    Apr. 14, 2016

(30) Foreign Application Priority Data

Oct. 13, 2014  (KR) .......................... 10-2014-0137543

(51) Int. Cl.
*H01L 27/32* (2006.01)
*H01L 51/52* (2006.01)
*H01L 51/56* (2006.01)

(52) U.S. Cl.
CPC ................ *H01L 27/3276* (2013.01)

(58) Field of Classification Search
CPC ......... H01L 27/32; H01L 51/52; H01L 51/56; H01L 27/3276; H01L 27/3258; H01L 27/3262; H01L 27/3265; H01L 51/5237; H01L 2227/323

USPC .............................................. 257/40; 438/34
See application file for complete search history.

(56) References Cited

U.S. PATENT DOCUMENTS

| | | | |
|---|---|---|---|
| 2013/0095327 A1 | 4/2013 | Vardeny et al. | |
| 2014/0138637 A1* | 5/2014 | Yang ................... | H01L 27/1218 257/40 |
| 2014/0354596 A1* | 12/2014 | Djordjev .............. | G06K 9/0002 345/175 |
| 2015/0169136 A1* | 6/2015 | Ganti ................... | B06B 1/0666 345/177 |

(Continued)

FOREIGN PATENT DOCUMENTS

| | | |
|---|---|---|
| JP | 4493905 B2 | 4/2010 |
| KR | 10-0685831 B1 | 2/2007 |
| KR | 10-2013-0109393 A | 10/2013 |

*Primary Examiner* — Alexander Oscar Williams
(74) *Attorney, Agent, or Firm* — Lee & Morse, P.C.

(57) ABSTRACT

Provided is an organic light emitting diode display device, including a pixel substrate including a pixel unit displaying an image and a peripheral unit surrounding the pixel unit; a first insulating layer covering the pixel substrate; a fanout line on the first insulating layer of the peripheral unit; a second insulating layer covering the first insulating layer and the fanout line; an etching prevention member on the second insulating layer of the peripheral unit and preventing over-etching of the second insulating layer; a third insulating layer covering the second insulating layer; a peripheral potential voltage line on the third insulating layer of the peripheral unit and transferring a potential voltage; a passivation layer covering the third insulating layer; and an organic light emitting diode on the passivation layer of the pixel unit, in which the etching prevention member overlaps with the fanout line and the peripheral potential voltage line.

13 Claims, 13 Drawing Sheets

(56) References Cited

U.S. PATENT DOCUMENTS

2015/0269897 A1\* 9/2015 Kitsomboonloha . G09G 3/3648
345/205

\* cited by examiner

ORGANIC LIGHT EMITTING DIODE DISPLAY DEVICE AND MANUFACTURING METHOD THEREOF

CROSS-REFERENCE TO RELATED APPLICATION

Korean Patent Application No. 10-2014-0137543, filed on Oct. 13, 2014, in the Korean Intellectual Property Office, and entitled: "Organic Light Emitting Diode Display Device and Manufacturing Method Thereof," is incorporated by reference herein in its entirety.

BACKGROUND

1. Field

The present disclosure relates to an organic light emitting diode display device and a manufacturing method thereof.

2. Description of the Related Art

An organic light emitting diode display device may include two electrodes and an organic emission layer positioned therebetween and may emit light while an electron injected from one electrode and a hole injected from the other electrode are coupled with each other in the organic emission layer to form an exciton and the exciton discharges energy.

SUMMARY

Embodiments may be realized by providing an organic light emitting diode display device, including a pixel substrate including a pixel unit displaying an image and a peripheral unit surrounding the pixel unit; a first insulating layer covering the pixel substrate; a fanout line on the first insulating layer of the peripheral unit; a second insulating layer covering the first insulating layer and the fanout line; an etching prevention member on the second insulating layer of the peripheral unit and preventing overetching of the second insulating layer; a third insulating layer covering the second insulating layer; a peripheral potential voltage line on the third insulating layer of the peripheral unit and transferring a potential voltage; a passivation layer covering the third insulating layer; and an organic light emitting diode on the passivation layer of the pixel unit, in which the etching prevention member overlaps with the fanout line and the peripheral potential voltage line.

The organic light emitting diode display device may further include a sealing groove is on the third insulating layer of the peripheral unit and overlapping the etching prevention member and the fanout line.

The third insulating layer may include a third inorganic insulating layer contacting the second insulating layer and a third organic insulating layer covering the third inorganic insulating layer.

The organic light emitting diode display device may further include a contact hole in the third insulating layer of the pixel unit and including an inorganic contact hole of the third inorganic insulating layer and an organic contact hole of the third organic insulating layer, and the inorganic contact hole and the organic contact hole may have a same boundary line and may contact each other.

The organic light emitting diode display device may further include a semiconductor on the pixel substrate of the pixel unit; a first gate metal line on a same layer as the fanout line of the pixel unit; a second gate metal line on a same layer as the etching prevention member of the pixel unit; and a data metal line on a same layer as the peripheral potential voltage line of the pixel unit.

The first gate metal line may include a scan line transferring a scan signal, and the data metal line may include a data line and a driving voltage line transferring a data signal and a driving voltage, respectively.

The semiconductor may include a switching channel of a switching transistor connected with the scan line and the data line and a driving channel of a driving transistor connected with the switching transistor, and the driving channel may be curved.

The organic light emitting diode display device may further include a storage capacitor including a first storage electrode on the first insulating layer and overlapping the driving channel; and a second storage electrode on the second insulating layer, the second insulating layer covering the first storage electrode and overlapping the first storage electrode. The first storage electrode may be a driving gate electrode of the driving transistor, and the second gate metal line may include the second storage electrode.

The fanout line may be connected with the data line and may transfer the data signal to the data line from the outside.

The organic light emitting diode may include a pixel electrode on the passivation layer, an organic emission layer on the pixel electrode, and a common electrode on the organic emission layer, and the peripheral potential voltage line may be a peripheral common voltage line transferring a common voltage to the common electrode or a peripheral driving voltage line transferring a driving voltage to the pixel electrode.

Embodiments may be realized by providing a manufacturing method of an organic light emitting diode display device, the manufacturing method including forming a first insulating layer on a pixel substrate including a pixel unit and a peripheral unit; forming a fanout line on the first insulating layer of the peripheral unit; forming a second insulating layer on the first insulating layer and the fanout line; forming an etching prevention member on the second insulating layer of the peripheral unit; forming a third insulating layer on the second insulating layer and the etching prevention member; forming a peripheral potential voltage line transferring a potential voltage on the third insulating layer of the peripheral unit; forming a passivation layer on the third insulating layer; and forming an organic light emitting diode on the passivation layer of the pixel unit, in which the etching prevention member overlaps with the fanout line and the peripheral potential voltage line.

The manufacturing method may further include forming a sealing groove on the third insulating layer of the peripheral unit. The sealing groove may overlap the etching prevention member and the fanout line.

The third insulating layer may include a third inorganic insulating layer contacting the second insulating layer and a third organic insulating layer covering the third inorganic insulating layer, and forming of the sealing groove may include forming a contact hole in the third insulating layer by integrally etching the third inorganic insulating layer and the third organic insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
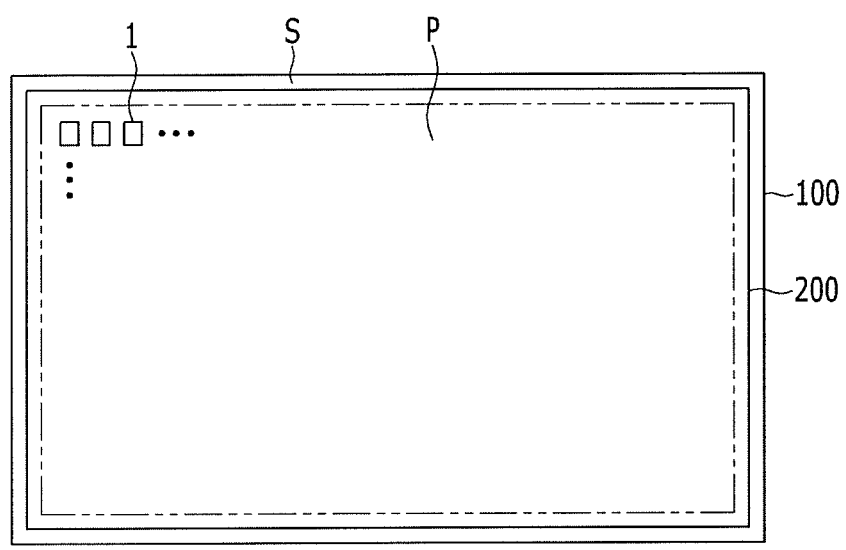
FIG. 1 illustrates a plan view of an organic light emitting diode display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present disclosure is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In addition, unless explicitly described to the contrary, the word "comprise" and variations such as "comprises" or "comprising", will be understood to imply the inclusion of stated elements but not the exclusion of any other elements. Further, throughout the specification, the word "on" means positioning on or below the object portion, but does not essentially mean positioning on the upper side of the object portion based on a gravity direction.

Further, throughout the specification, the word "on a plane" means viewing a target portion from the top, e.g., in plan view, and the word "on a cross section" means viewing a cross section formed by vertically cutting a target portion from the side.

Next, an organic light emitting diode display device according to the exemplary embodiment of the present disclosure will be described in detail with reference to FIGS. 1 to 9.

FIG. 1 illustrates a plan view of an organic light emitting diode display device according to an exemplary embodiment of the present disclosure.

As illustrated in FIG. 1, the organic light emitting diode display device according to the exemplary embodiment of the present disclosure may include a pixel substrate 100 including a pixel unit P with a plurality of pixels 1 configured by an organic light emitting diode OLED displaying an image and a peripheral unit S surrounding the pixel unit P and with a plurality of peripheral circuits or peripheral lines, and a sealing substrate 200 facing the pixel substrate 100 to cover the pixel substrate 100.

Hereinafter, a pixel formed in the pixel unit P of the organic light emitting diode display device according to the exemplary embodiment of the present disclosure will be described below in detail.

Figure 2:
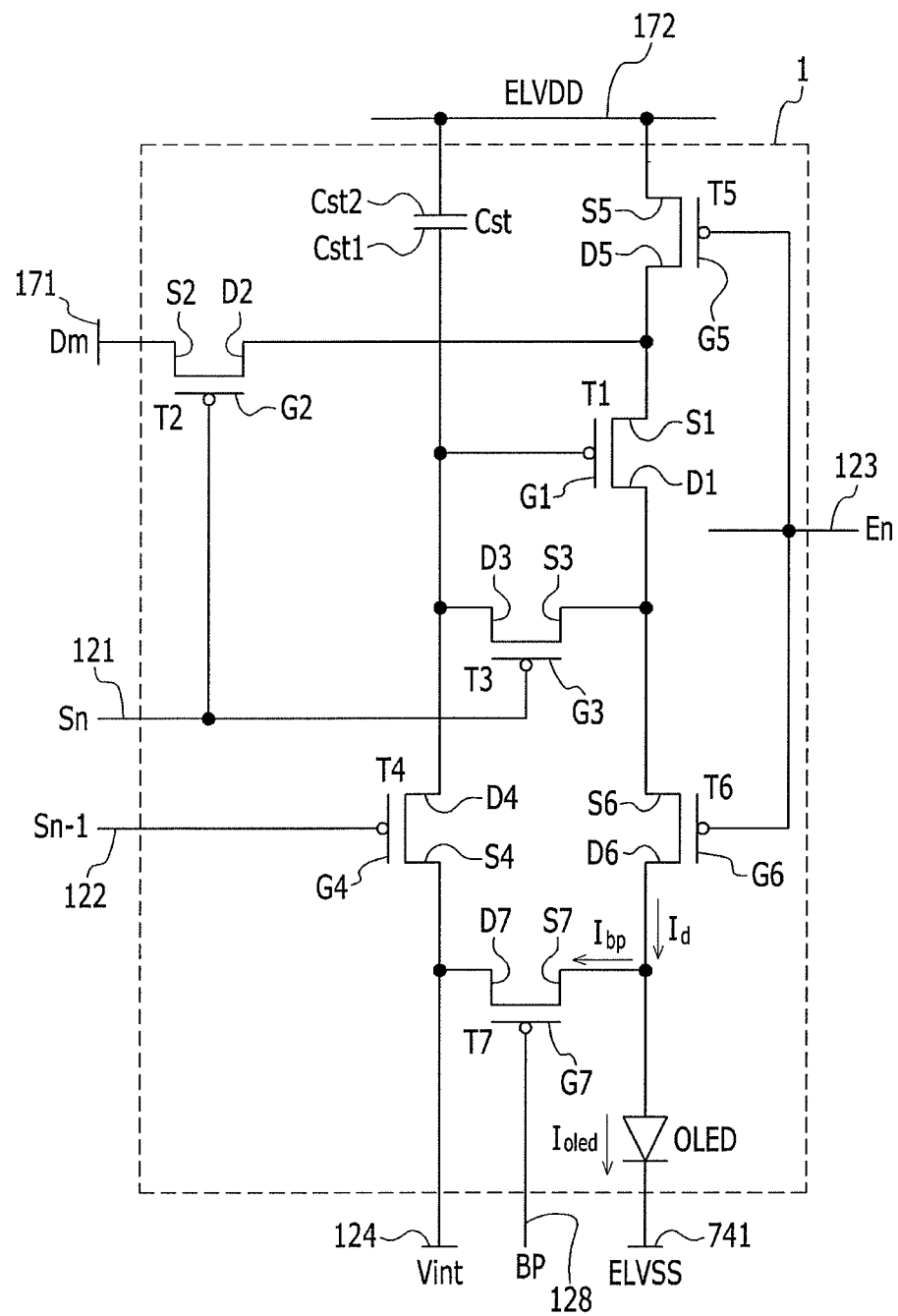
FIG. 2 illustrates an equivalent circuit diagram of one pixel of a pixel unit in the organic light emitting diode display device according to an exemplary embodiment of the present disclosure.

FIG. 2 illustrates an equivalent circuit diagram of one pixel of the pixel unit of the organic light emitting diode display device according to an exemplary embodiment of the present disclosure.

As illustrated in FIG. 2, one pixel 1 formed in the pixel unit P of the organic light emitting diode display device according to the exemplary embodiment of the present disclosure may include a plurality of signal lines 121, 122, 123, 128, 171, 172, and 192, a plurality of transistors T1, T2, T3, T4, T5, T6, and T7 connected to the plurality of signal lines, a storage capacitor Cst, and an organic light emitting diode OLED.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7.

The signal lines 121, 122, 123, 128, 171, 172, and 192 may include a scan line 121 transferring a scan signal Sn, a previous scan line 122 transferring a previous scan signal Sn-1 to the initialization transistor T4, a light emission control line 123 transferring a light emission control signal EM to the operation control transistor T5 and the light emission control transistor T6, a bypass control line 128 transferring a bypass signal BP to the bypass transistor T7, a data line 171 crossing the scan line 121 and transferring a data signal Dm, a driving voltage line 172 transferring a driving voltage ELVDD and formed to be substantially parallel with the data line 171, and an initialization voltage line 192 transferring an initialization voltage Vint initializing the driving transistor T1.

A gate electrode G1 of the driving transistor T1 may be connected with one end Cst1 of the storage capacitor Cst, a source electrode S1 of the driving transistor T1 may be connected with the driving voltage line 172 via the operation control transistor T5, and a drain electrode D1 of the driving transistor T1 may be electrically connected with an anode of the organic light emitting diode OLED via the light emission control transistor T6. The driving transistor T1 may receive the data signal Dm according to a switching operation of the switching transistor T2 to supply a driving current Id to the organic light emitting diode OLED.

A gate electrode G2 of the switching transistor T2 may be connected with the scan line 121, a source electrode S2 of the switching transistor T2 may be connected with the data line 171, and a drain electrode D2 of the switching transistor T2 may be connected with the source electrode S1 of the driving transistor T1 and connected with the driving voltage line 172 via the operation control transistor T5. The switching transistor T2 may be turned on according to the scan signal Sn received through the scan line 121 to perform a switching operation transferring the data signal Dm transferred to the data line 171 to the source electrode of the driving transistor T1.

A gate electrode G3 of the compensation transistor T3 may be connected with the scan line 121, a source electrode S3 of the compensation transistor T3 may be connected with the drain electrode D1 of the driving transistor T1 and connected with an anode of the organic light emitting diode OLED via the light emission control transistor T6, and a drain electrode D3 of the compensation transistor T3 may be connected with the drain electrode D4 of the initialization transistor T4, one end Cst1 of the storage capacitor Cst, and the gate electrode G1 of the driving transistor T1 together. The compensation transistor T3 may be turned on according to the scan signal Sn received through the scan line 121 to connect the gate electrode G1 and the drain electrode Dl of the driving transistor T1 and diode-connect the driving transistor T1.

A gate electrode G4 of the initialization transistor T4 may be connected with the previous scan line 122, a source electrode S4 of the initialization transistor T4 may be connected with the initialization voltage line 192, and a drain electrode D4 of the initialization transistor T4 may be connected together with one end Cst1 of the storage capacitor Cst and the gate electrode G1 of the driving transistor T1 via the drain electrode D3 of the compensation transistor T3. The initialization transistor T4 may be turned on according to the previous scan signal Sn-1 received through the previous scan line 122 to transfer the initialization voltage Vint to the gate electrode G1 of the driving transistor T1 and then perform an initialization operation initializing a gate voltage of the gate electrode G1 of the driving transistor T1.

A gate electrode G5 of the operation control transistor T5 may be connected with the light emission control line 123, a source electrode S5 of the operation control transistor T5 may be connected with the driving voltage line 172, and a drain electrode D5 of the operation control transistor T5 may be connected with the source electrode Si of the driving transistor T1 and the drain electrode S2 of the switching transistor T2.

A gate electrode G6 of the light emission control transistor T6 may be connected with the light emission control line 123, a source electrode S6 of the light emission control transistor T6 may be connected with the drain electrode D1 of the driving transistor T1 and the source electrode S3 of the compensation transistor T3, and a drain electrode D6 of the light emission control transistor T6 may be electrically connected with an anode of the organic light emitting diode OLED. The operation control transistor T5 and the light emission control transistor T6 may be simultaneously turned on according to the light emission control signal EM received through the light emission control line 123, and the driving voltage ELVDD may be compensated through the diode-connected driving transistor T1 to be transferred to the organic light emitting diode OLED.

A gate electrode G7 of the bypass transistor T7 may be connected with the bypass control line 128, a source electrode S7 of the bypass transistor T7 may be connected together with the drain electrode D6 of the light emission control transistor T6 and the anode of the organic light emitting diode OLED, and a drain electrode D7 of the bypass transistor T7 may be connected together with the initialization voltage line 192 and the source electrode S4 of the initialization transistor T4.

The other end Cst2 of the storage capacitor Cst may be connected with the driving voltage line 172, and a cathode of the organic light emitting diode OLED may be connected with a common voltage line 741 transferring a common voltage ELVSS.

In the exemplary embodiment of the present disclosure, the structure having seven transistors including the bypass transistor T7 and one capacitor is illustrated. In an embodiment, the number of transistors and the number of capacitors may be variously modified.

Hereinafter, a detailed operation process of one pixel of the pixel unit of the organic light emitting diode display device according to the exemplary embodiment of the present disclosure will be described in detail with reference to FIG. 3.

Figure 3:
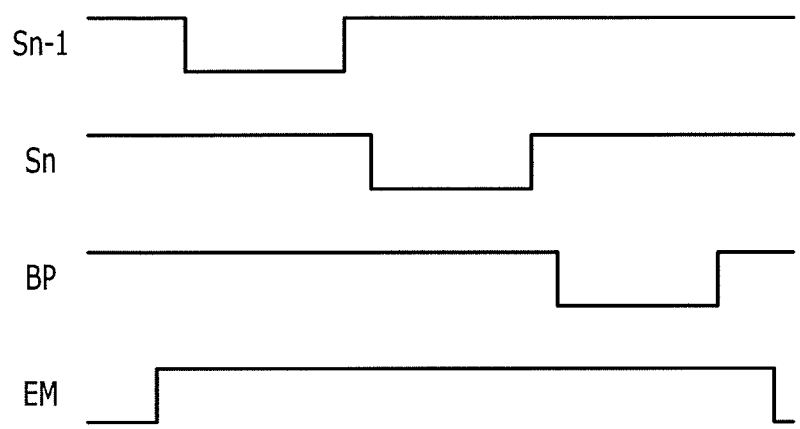
FIG. 3 illustrates a timing diagram of a signal applied to one pixel of the pixel unit in the organic light emitting diode display device according to the exemplary embodiment of the present disclosure.

FIG. 3 illustrates a timing diagram of a signal applied to one pixel of the pixel unit in the organic light emitting diode display device according to the exemplary embodiment of the present disclosure.

As illustrated in FIG. 3, first, for an initialization period, the previous scan signal Sn-1 at a low level may be supplied through the previous scan line 122. The light emission control signal EM at a low level may already be applied through the light emission control line 123. Then, the initialization transistor T4 may be turned on in response to the previous scan signal Sn-1 at the low level, the initialization voltage Vint may be connected from the initialization voltage line 192 to the gate electrode of the driving transistor T1 through the initialization transistor T4, and the driving transistor T1 may be initialized by the initialization voltage Vint.

Thereafter, for a data programming period, the scan signal Sn having the low level may be supplied through the scan line 121. Then, the switching transistor T2 and the compensation transistor T3 may be turned on in response to the scan signal Sn at the low level. The driving transistor T1 may be diode-connected by the turned-on compensation transistor T3 and biased in a forward direction.

Then, a compensation voltage Dm+Vth (Vth has a negative (−) value) reduced from the data signal Dm supplied from the data line 171 by a threshold voltage Vth of the driving transistor T1 may be applied to the gate electrode G1 of the driving transistor T1. The driving voltage ELVDD and the compensation voltage Dm+Vth may be applied to both ends of the storage capacitor Cst, and a charge corresponding to a voltage difference between both ends may be stored in the storage capacitor Cst.

Thereafter, for the emission period, the light emission control signal EM supplied from the light emission control line 123 may be changed from the high level to the low level. Then, for the emission period, the operation control transistor T5 and the light emission control transistor T6 may be turned on by the light emission control signal EM at the low level.

Then, a driving current Id may be generated according to a voltage difference between the gate voltage of the gate electrode G1 of the driving transistor T1 and the driving voltage ELVDD, and the driving current Id may be supplied to the organic light emitting diode OLED through the light emission control transistor T6. For a light emission period, a gate-source voltage Vgs of the driving transistor T1 may be maintained at '(Dm+Vth)-ELVDD' by the storage capacitor Cst, and according to a current-voltage relationship of the driving transistor T1, the driving current Id may be proportional to the square '(Dm-ELVDD)2' of a value obtained by subtracting the threshold voltage from the source-gate voltage. Accordingly, the driving current Id may be determined regardless of the threshold voltage Vth of the driving transistor T1.

The bypass transistor T7 may receive the bypass signal BP from the bypass control line 128. The bypass signal BP may be a voltage at a predetermined level which may always turn off the bypass transistor T7, the bypass transistor T7 may receive a voltage at a transistor off level from the gate electrode G7, and thus the bypass transistor T7 may always be turned off, and a part of the driving current Id may flow out through the bypass transistor T7 as a bypass current Ibp in the off state.

Even in the case where a minimum current of the driving transistor T1 displaying a black image flows as the driving current, when the organic light emitting diode OLED emits light, the black image may not be displayed well. Accordingly, the bypass transistor T7 of the organic light emitting diode display device according to the exemplary embodiment of the present disclosure may distribute a part of the minimum current of the driving transistor T1 as the bypass current Ibp to another current path other than the current path of the organic light emitting diode side. The minimum current of the driving transistor T1 means a current under a condition in which the driving transistor T1 is turned off because the gate-source voltage Vgs of the driving transistor T1 is smaller than the threshold voltage Vth. The minimum driving current (for example, a current of 10 pA or less) under the condition in which the driving transistor T1 is turned off may be transferred to the organic light emitting diode OLED to be expressed as an image with black luminance. When the minimum driving current expressing the black image flows, an influence on a bypass transfer of the bypass current Ibp may be large, but when a large driving current expressing an image such as a normal image or a white image flows, there may be little influence on the bypass current Ibp. Accordingly, when the driving current displaying a black image flows, the light emission current Ioled of the organic light emitting diode OLED which is reduced by the current amount of the bypass current Ibp which flows out from the driving current Id through the bypass transistor T7 has a minimum current amount as a level which may exactly express the black image. Therefore, a black luminance image may be exactly implemented by using the bypass transistor T7, and a contrast ratio may be improved. In FIG. 3, the bypass signal BP is, for example, the same as a next scan signal Sn+1.

Next, a detailed structure of the pixel unit and the peripheral unit of the organic light emitting diode display device illustrated in FIGS. 1 to 3 will be described in detail with reference to FIGS. 4 to 9.

Figure 4:
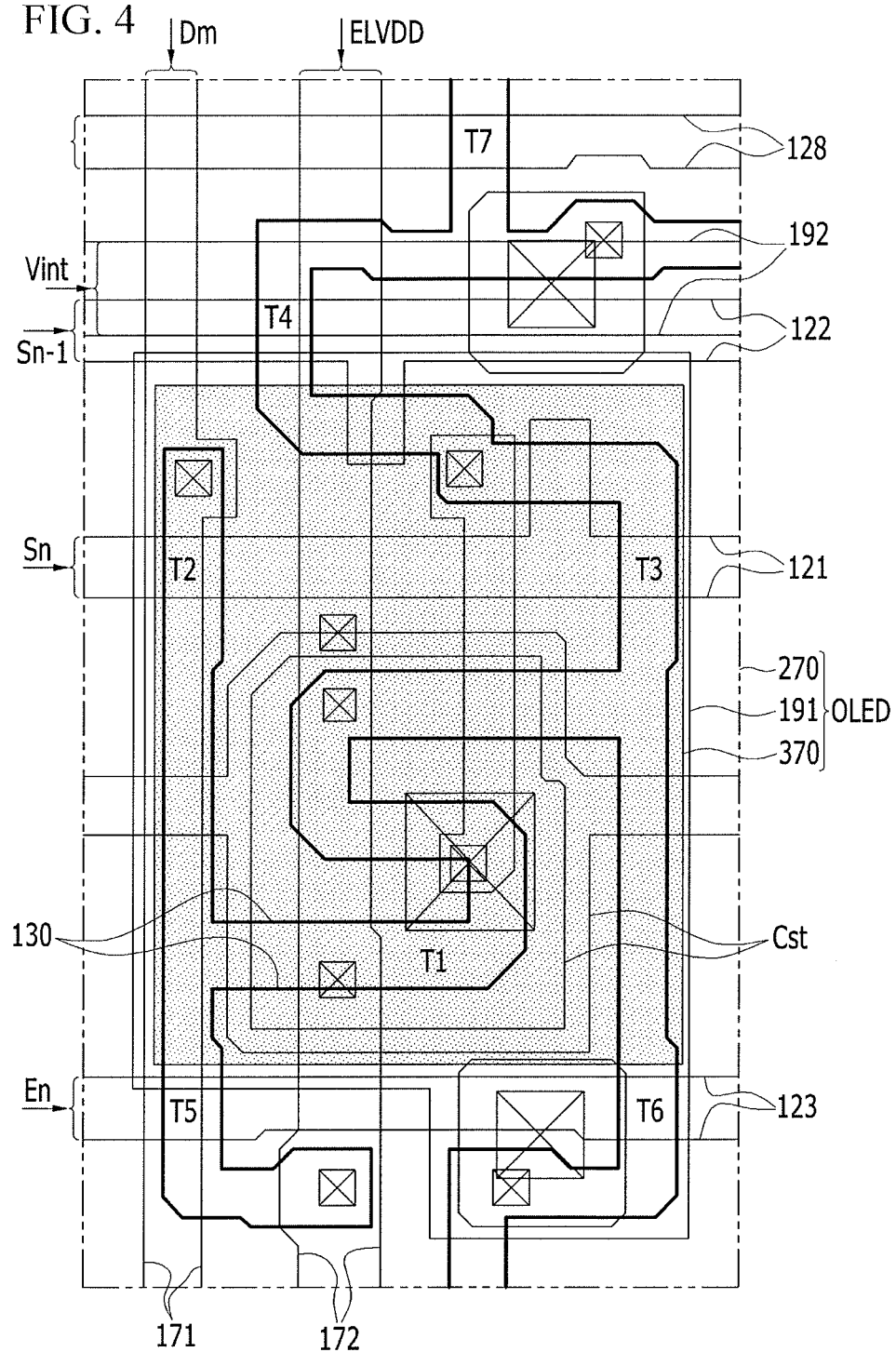
FIG. 4 illustrates a diagram schematically of a plurality of transistors and capacitors of the pixel unit in the organic light emitting diode display device according to the exemplary embodiment of the present disclosure.
Figure 5:
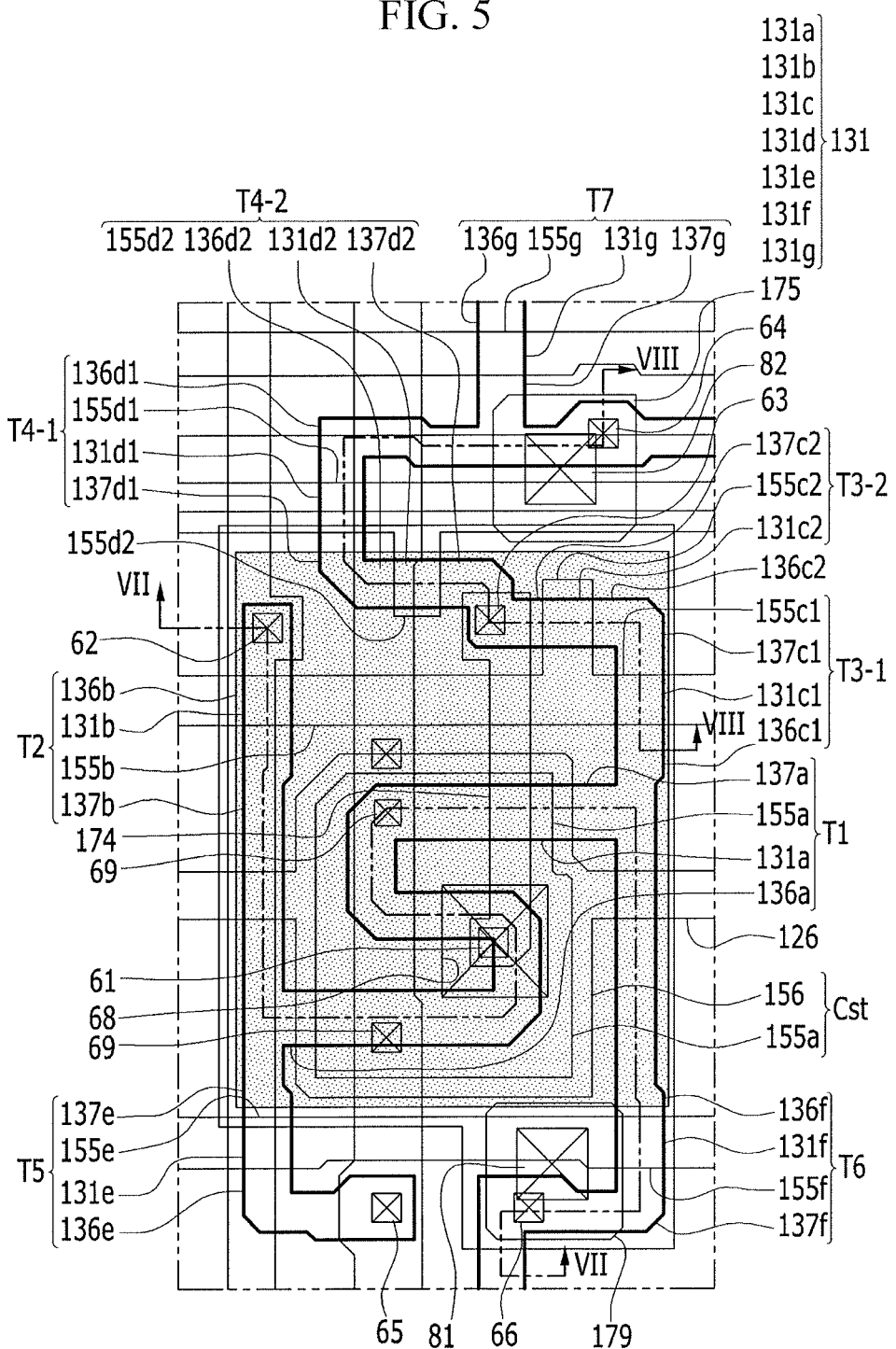
FIG. 5 illustrates a detailed layout view of one pixel of FIG. 4.
Figure 6:
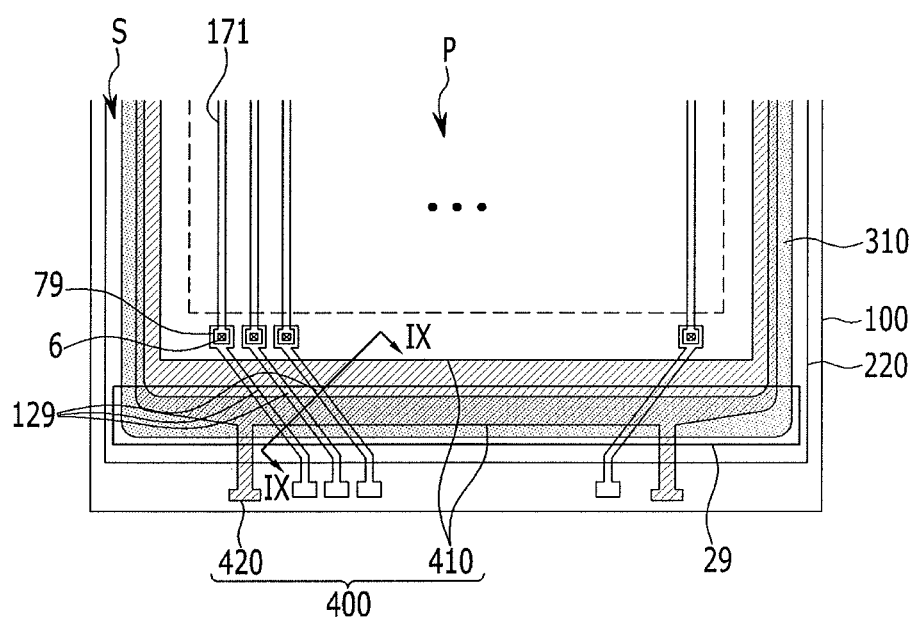
FIG. 6 illustrates a plan view schematically enlarging a peripheral unit of the organic light emitting diode display device according to the exemplary embodiment of the present disclosure.
Figure 7:
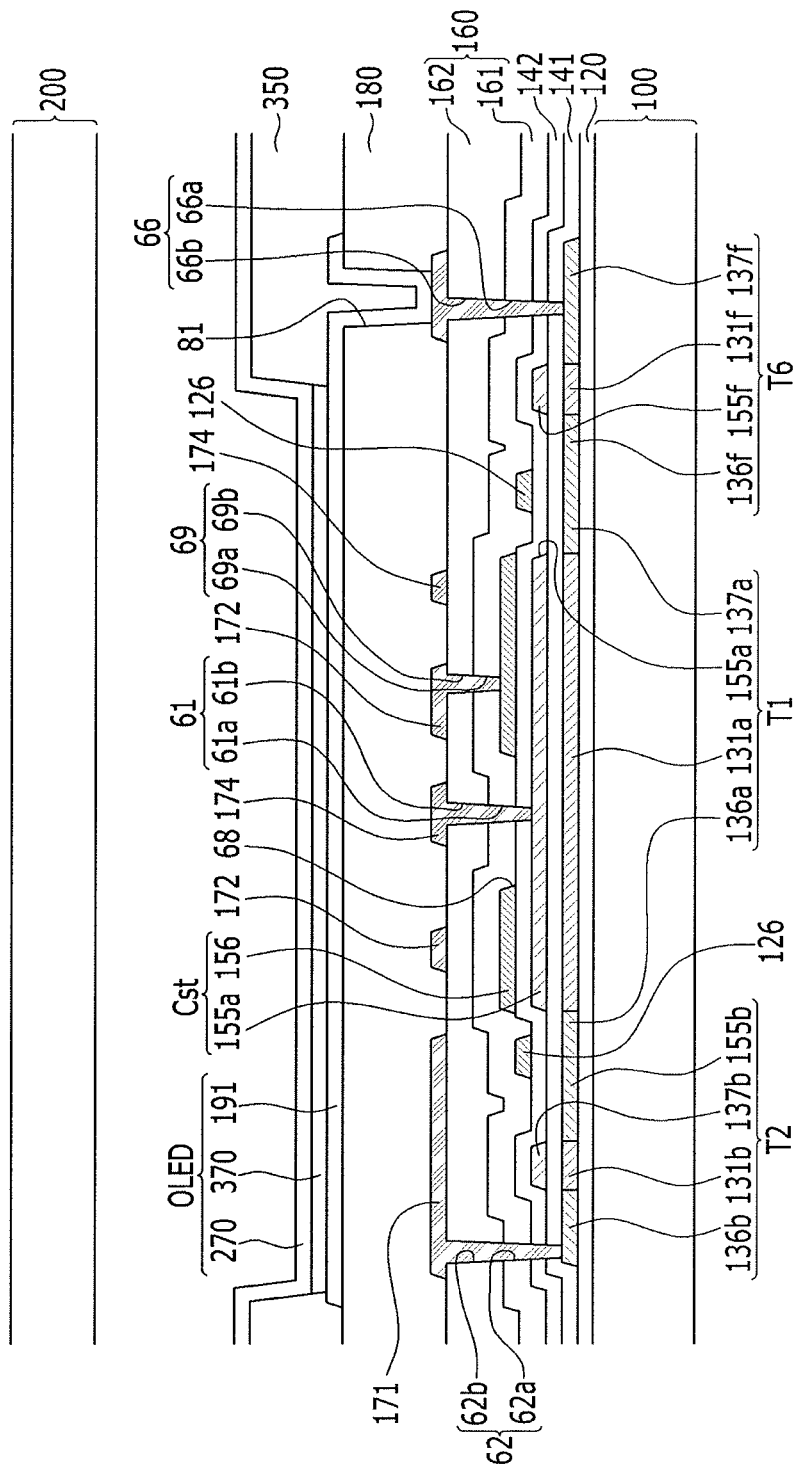
FIG. 7 illustrates a cross-sectional view of the organic light emitting diode display device of FIG. 5 taken along line VII-VII.
Figure 8:
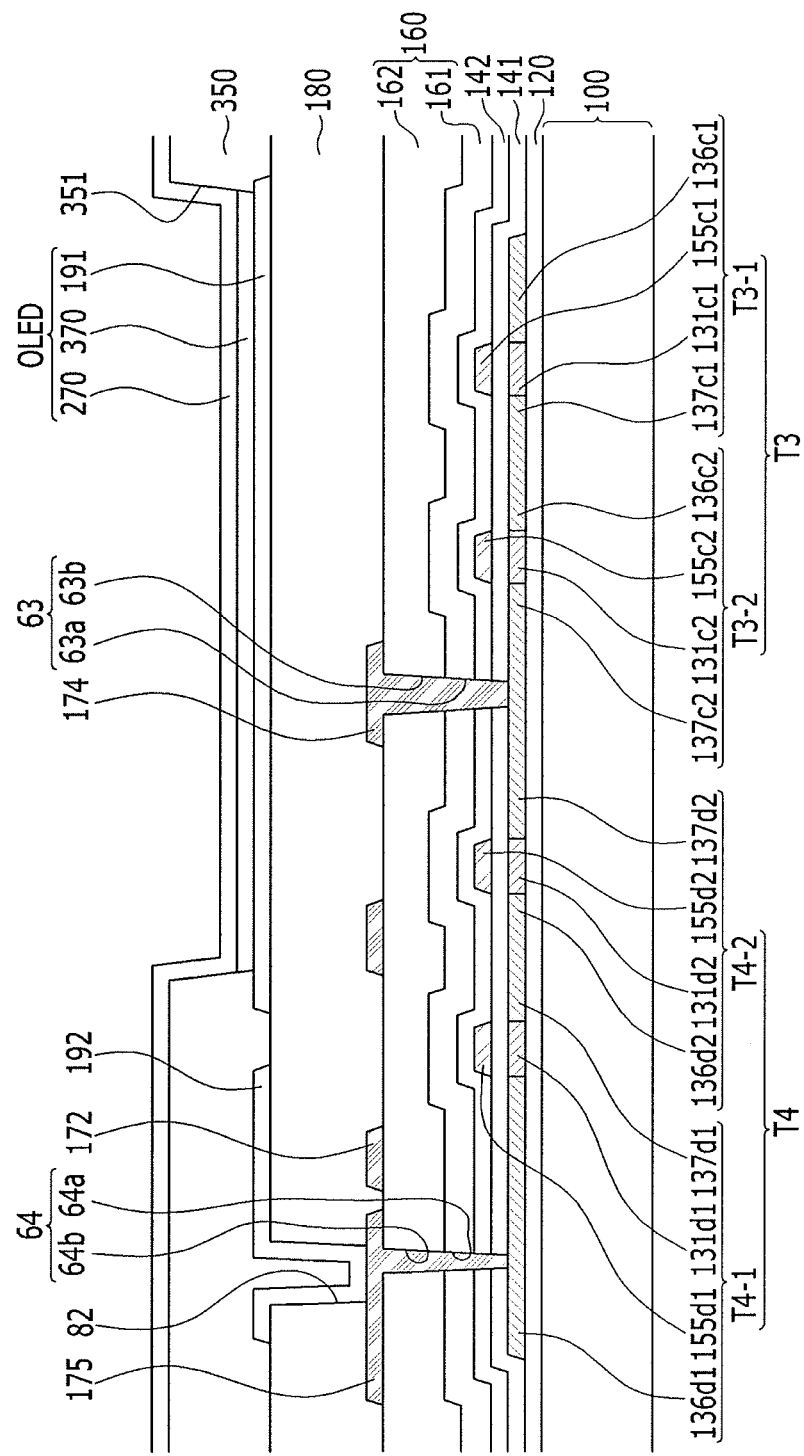
FIG. 8 illustrates a cross-sectional view of the organic light emitting diode display device of FIG. 5 taken along line VIII-VIII.
Figure 9:
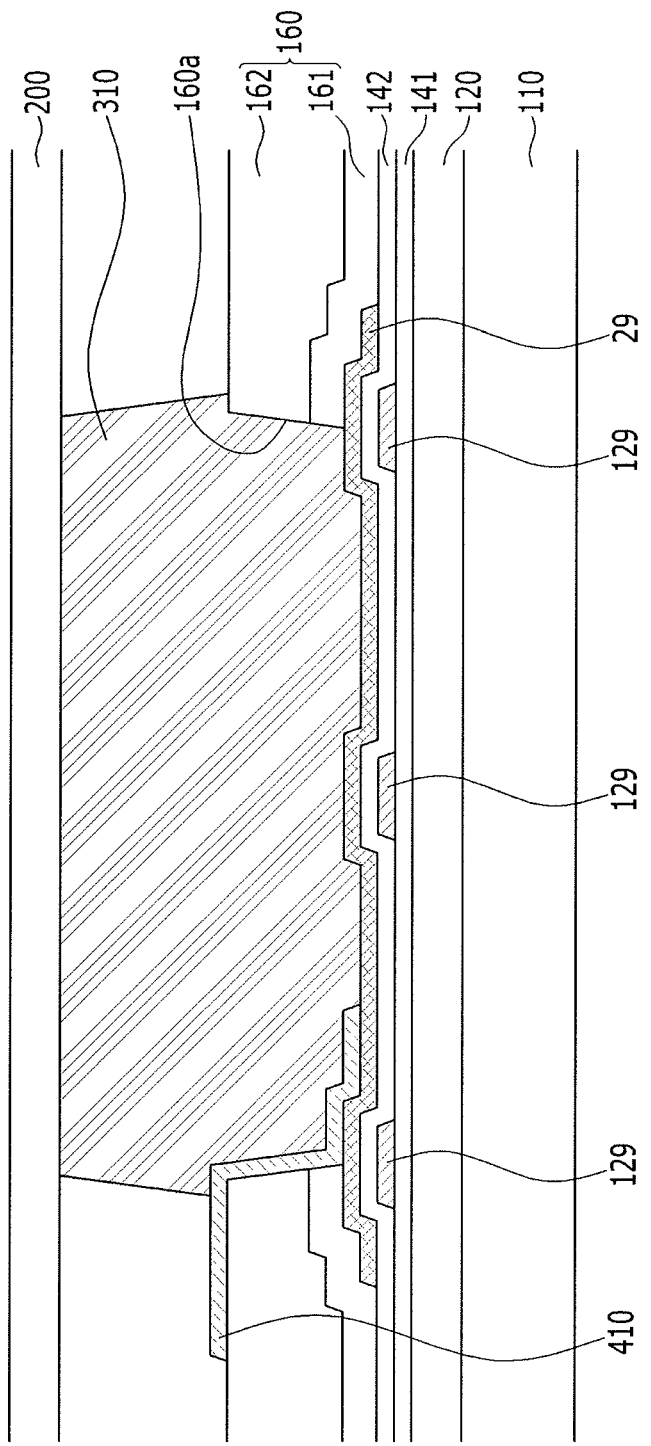
FIG. 9 illustrates a cross-sectional view of FIG. 6 taken along line IX-IX.

FIG. 4 illustrates a diagram schematically of a plurality of transistors and capacitors of the pixel unit in the organic light emitting diode display device according to the exemplary embodiment of the present disclosure, FIG. 5 illustrates a detailed layout view of one pixel of FIG. 4, FIG. 6 illustrates a plan view schematically enlarging a peripheral unit of the organic light emitting diode display device according to the exemplary embodiment of the present disclosure, FIG. 7 illustrates a cross-sectional view of the organic light emitting diode display device of FIG. 5 taken along line VII-VII, FIG. FIG. 8 illustrates a cross-sectional view of the organic light emitting diode display device of FIG. 5 taken along line VIII-VIII, and FIG. 9 illustrates a cross-sectional view of FIG. 6 taken along line IX-IX.

Hereinafter, detailed planar structures of the pixel unit and the peripheral unit of the organic light emitting diode display device according to the exemplary embodiment of the present disclosure will be first described in detail with reference to FIGS. 4 to 6 and detailed cross-sectional structures of the pixel unit and the peripheral unit will be described in detail with reference to FIGS. 7 to 9.

First, as illustrated in FIG. 4, the organic light emitting diode display device according to the exemplary embodiment of the present disclosure may include the scan line 121, the previous scan line 122, the light emission control line 123, and the bypass control line 128 which apply the scan signal Sn, the previous scan signal Sn−1, the light emission control signal EM, and the bypass signal BP, respectively and may be formed in a row direction, and may include the data line 171 and the driving voltage line 172 which cross the scan line 121, the previous scan line 122, the light emission control line 123, and the bypass control line 128 and apply the data signal Dm and the driving voltage ELVDD to the pixel, respectively. The initialization voltage Vint may be transferred to the compensation transistor T3 through the initialization voltage line 192.

In the pixel, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED including a pixel electrode 191, an organic emission layer 370, and a common electrode 270 may be formed. The compensation transistor T3 and the initialization transistor T4 may be configured as a dual gate structure transistor in order to block a leakage current.

Channels of the driving transistor T1, the switching transistor T2, the compensation transistor T3, the initialization transistor T4, the operation control transistor T5, the light emission control transistor T6, and the bypass transistor T7 may be formed in one semiconductor 130 connected, and the semiconductor 130 may be formed to be curved in various shapes. The semiconductor 130 may be made of a polycrystalline semiconductor material or an oxide semiconductor material. The oxide semiconductor material may include an oxide based on titanium (Ti), hafnium (Hf), zirconium (Zr), aluminum (Al), tantalum (Ta), germanium (Ge), zinc (Zn), gallium (Ga), tin (Sn), or indium (In), or indium-gallium-zinc oxide (InGaZnO$_4$), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. The semiconductor 130 may be made of the oxide semiconductor material, and a separate passivation layer that may protect the oxide semiconductor material which may be vulnerable to an external environment such as a high temperature may be added.

The semiconductor 130 may include a channel 131 which may be channel-doped with an N-type impurity or a P-type impurity, and a source doping part and a drain doping part which may be formed at both sides of the channel and doped with an opposite-type doping impurity to the doping impurity doped on the channel. In the exemplary embodiment, the source doping part and the drain doping part correspond to the source electrode and the drain electrode, respectively. The source electrode and the drain electrode formed in the semiconductor 130 may be formed by doping only the corresponding regions. In the semiconductor 130, a region between source electrodes and drain electrodes of different transistors may be doped, and the source electrode and the drain electrode may be electrically connected to each other.

As illustrated in FIG. 5, the channel 131 may include a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 may include the driving channel 131a, a driving gate electrode 155a, a driving source electrode 136a, and a driving drain electrode 137a. The driving channel 131a may be curved, e.g., on a plane, and may have an oblique shape or a zigzag shape. By forming a curved driving channel 131a, the driving channel 131a may be formed to be elongated in a narrow space, and a driving range of the gate voltage applied to the driving gate electrode 155a may be increased by the elongated driving channel 131a. Since the driving range of the gate voltage is increased, a gray scale of light emitted from the organic light emitting diode OLED may be finely controlled by changing the magnitude of the gate voltage, and the resolution of the organic light emitting diode display device may be enhanced and display quality may be improved. Various examples such as 'reverse S', 'S', 'M', and 'W' may be implemented by variously modifying the shape of the driving channel 131a.

The driving gate electrode 155a may overlap with the driving channel 131a, and the driving source electrode 136a and the driving drain electrode 137a may not overlap with the driving channel 131a.

The switching transistor T2 may include the switching channel 131b, a switching gate electrode 155b, a switching source electrode 136b, and a switching drain electrode 137b. The switching gate electrode 155b which may be a part extended downward from the scan line 121 may overlap with the switching channel 131b, and the switching source electrode 136b and the switching drain electrode 137b may not overlap with the switching channel 131b. The switching source electrode 136b may be connected with the data line 171 through a contact hole 62.

Two compensation transistors T3 may be formed in order to prevent the leakage current and may include a first compensation transistor T3-1 and a second compensation transistor T3-2 which may be adjacent to each other. The first compensation transistor T3-1 may be positioned around the scan line 121, and the second compensation transistor T3-2 may be positioned around a projection of the scan line 121. The first compensation transistor T3-1 may include a first compensation channel 131c1, a first compensation gate electrode 155c1, a first compensation source electrode 136c1, and a first compensation drain electrode 137c1, and the second compensation transistor T3-2 may include a second compensation channel 131c2, a second compensation gate electrode 155c2, a second compensation source electrode 136c2, and a second compensation drain electrode 137c2.

The first compensation gate electrode 155c1 which is a part of the scan line 121 may overlap with the first compensation channel 131c1, and the first compensation source electrode 136c1 and the first compensation drain electrode 137c1 may not overlap with the first compensation channel 131c1. The first compensation source electrode 136c1 may be connected with the light emission control source electrode 136f and the driving drain electrode 137a, and the first compensation drain electrode 137c1 may be connected with the second compensation source electrode 136c2.

The second compensation gate electrode 155c2 which is a projection protruding upward from the scan line 121 may overlap with the second compensation channel 131c2, and the second compensation source electrode 136c2 and the second compensation drain electrode 137c2 may not overlap with the second compensation channel 131c2. The second compensation drain electrode 137c2 may be connected with a first data connection member 174 through a contact hole 63.

Two initialization transistors T4 may be formed in order to prevent the leakage current and may include a first initialization transistor T4-1 and a second initialization transistor T4-2 which may be adjacent to each other. The first initialization transistor T4-1 may be positioned around the previous scan line 122, and the second initialization transistor T4-2 may be positioned around a projection of the previous scan line 122. The first initialization transistor T4-1 may include a first initialization channel 131d1, a first initialization gate electrode 155d1, a first initialization source electrode 136d1, and a first initialization drain electrode 137d1, and the second initialization transistor T4-2 may include a second initialization channel 131d2, a second initialization gate electrode 155d2, a second initialization source electrode 136d2, and a second initialization drain electrode 137d2.

The first initialization gate electrode 155d1 which is a part of the previous scan line 122 may overlap with the first initialization channel 131d1, and the first initialization source electrode 136d1 and the first initialization drain electrode 137d1 may not overlap with the first initialization channel 131d1. The first initialization source electrode 136d1 may be connected with a second data connection member 175 through a contact hole 64, and the first initialization drain electrode 137d1 may be connected with the second initialization source electrode 136d2.

The second initialization gate electrode 155d2 which is a projection protruding downward from the previous scan line 122 may overlap with the second initialization channel 131d2, and the second initialization source electrode 136d2 and the second initialization drain electrode 137d2 may not overlap with the second initialization channel 131c2. The second initialization drain electrode 137d2 may be connected with the first data connection member 174 through the contact hole 63.

The compensation transistor T3 may include two of the first compensation transistor T3-1 and the second compensation transistor T3-2, the initialization transistor T4 may include two of the first initialization transistor T4-1 and the second initialization transistor T4-2, and it may be possible to efficiently prevent the leakage current from being generated by blocking a electron moving path of the semiconductor 130 in the off state.

The operation control transistor T5 may include an operation control channel 131e, an operation control gate electrode 155e, an operation control source electrode 136e, and an operation control drain electrode 137e. The operation control gate electrode 155e which is a part of the light emission control line 123 may overlap with the operation control channel 131e, and may not overlap with the operation control source electrode 136e and the operation control drain electrode 137e. The operation control source electrode 136e may be connected with a part of the driving voltage line 172 through a contact hole 65.

The light emission control transistor T6 may include a light emission control channel 131f, a light emission control gate electrode 155f, a light emission control source electrode 136f, and a light emission control drain electrode 137f. The light emission control gate electrode 155f which is a part of the light emission control line 123 may overlap with the light emission control channel 131f, and may not overlap with the light emission control source electrode 136f and the light emission control drain electrode 137f. The light emission control drain electrode 137f may be connected with a third data connection member 179 through a contact hole 66.

The bypass transistor T7 may include a bypass channel 131g, a bypass gate electrode 155g, a bypass source electrode 136g, and a bypass drain electrode 137g. The bypass gate electrode 155g which is a part of the bypass control line 128 may overlap with the bypass channel 131g and may not overlap with the bypass source electrode 136g and the bypass drain electrode 137g. The bypass source electrode 136g may be directly connected with the light emission control drain electrode 137f, and the bypass drain electrode 137g may be connected with a second data connection member 175 through a contact hole 82.

One end of the driving channel 131a of the driving transistor Ti may be connected with the switching drain electrode 137b and the operation control drain electrode 137e, and the other end of the driving channel 131a may be connected with the compensation source electrode 136c and the light emission control source electrode 136f.

The storage capacitor Cst may include a first storage electrode 155a and a second storage electrode 156 which may be disposed with a second insulating layer 142 therebetween. The first storage electrode 155a may correspond to the driving gate electrode 155a, and the second storage electrode 156 may be a portion extended from the storage line 126 and may occupy a larger area than the driving gate electrode 155a and may fully cover the driving gate electrode 155a. Herein, the second insulating layer 142 may be a dielectric material, and a storage capacitance may be determined by charges stored in the storage capacitor Cst and a voltage between the two electrodes 155a and 156. The driving gate electrode 155a may be used as the first storage electrode 155a, and it may be possible to ensure a space in which the storage capacitor may be formed within a space narrowed by the driving channel 131a having a large area in the pixel.

The first storage electrode 155a which is the driving gate electrode 155a may be connected with one end of the first data connection member 174 through the contact hole 61 and a storage opening 68. The storage opening 68 may be an opening formed in the second storage electrode 156. The first data connection member 174 may be formed on the same layer to be substantially parallel to the data line 171 and the other end of the first data connection member 174 may be connected with the second compensation drain electrode 137c2 of the second compensation transistor T3-2 and the second initialization drain electrode 137d2 of the second initialization transistor T4-2 through the contact hole 63. Accordingly, the first data connection member 174 may connect the driving gate electrode 155a and the second compensation drain electrode 137c2 of the second compensation transistor T3-2, and the second initialization drain electrode 137d2 of the second initialization transistor T4-2 to each other.

The second storage electrode 156 may be connected with the driving voltage line 172 through a contact hole 69.

The storage capacitor Cst may store a storage capacitance corresponding to a difference between the driving voltage ELVDD transferred to the second storage electrode 156 through the driving voltage line 172 and the gate voltage of the driving gate electrode 155a.

The third data connection member 179 may be connected with the pixel electrode 191 through a contact hole 81 and the second data connection member 175 may be connected with the initialization voltage line 192 through a contact hole 82.

As illustrated in FIG. 6, a fanout line 129 transferring the data signal Dm may be formed in the peripheral unit P. The fanout line 129 may be connected with the data pad 79 which is an end of the data line 171 through a contact hole 6, and the fanout line 129 may receive the data signal Dm from the outside to transfer the data signal Dm to the data line 171 through a data pad 79.

In the peripheral unit P, a peripheral potential voltage line 400 transferring a potential voltage including the common voltage ELVSS or the driving voltage ELVDD may be formed. The peripheral potential voltage line 400 may be a peripheral common voltage line transferring the common voltage ELVSS to the common electrode 270 or a peripheral driving voltage line transferring the driving voltage ELVDD to the pixel electrode 191. The peripheral potential voltage line may be the peripheral common voltage line 400, as illustrated and described in the exemplary embodiment.

The peripheral potential voltage line 400 may include a common voltage connection unit 410 formed to surround the pixel unit P, and a plurality of common voltage pads 420 extended from the common voltage connection unit 410 and to which the common voltage may be applied from the outside. One end of the common voltage connection unit 410 may contact the common electrode 270 to transfer the common voltage ELVSS applied from the common voltage pad 420 to the common electrode 270.

The common voltage connection unit 410 of the peripheral potential voltage line 400 and the fanout line 129 which may be formed in the peripheral unit P cross each other. In order to prevent the common voltage connection unit 410 and the fanout line 129 from being disconnected from each other by overetching of a third insulating layer 160, an etching prevention member 29 may be formed between the fanout line 129 and the common voltage connection unit 410.

The etching prevention member may be formed between the fanout line and the peripheral potential voltage line, and an insulating layer formed between the gate metal line and the data metal line and formed by a double layer of an inorganic layer and an organic layer may be integrally etched. Accordingly, manufacturing cost and a manufacturing time may be shortened by reducing the number of masks.

Hereinafter, cross-sectional structures of the pixel unit and the peripheral unit in the organic light emitting diode display device according to the exemplary embodiment of the present disclosure will be described in detail according to a lamination order with reference to FIGS. 7 to 9.

Since a lamination structure of the operation control transistor T5 may be mostly the same as that of the light emission control transistor T6, a detailed description thereof will be omitted.

A buffer layer 120 may be formed on the pixel substrate 100. The pixel substrate 100 may be formed by insulating substrates made of, for example, glass, crystal, ceramic, or plastic, the buffer layer 120 may block impurities from the pixel substrate 100 during a crystallization process for forming a polycrystalline semiconductor, and may improve characteristics of the polycrystalline semiconductor and reduce stress applied to the pixel substrate 100.

On the buffer layer 120 of the pixel unit P, a semiconductor 130 may be formed, which may include a driving channel 131a, a switching channel 131b, a compensation channel 131c, an initialization channel 131d, an operation control channel 131e, and a light emission control channel 131f. A driving source electrode 136a and a driving drain electrode 137a may be formed on both sides of the driving channel 131a in the semiconductor 130 and a switching source electrode 136b and a switching drain electrode 137b may be formed on both sides of the switching channel 131b. A first compensation source electrode 136c1 and a first compensation drain electrode 137c1 may be formed on both sides of a first compensation channel 131c1, a second compensation source electrode 136c2 and a second compensation drain electrode 137c2 may be formed on both sides of a second compensation channel 131c2, a first initialization source electrode 136d1 and a first initialization drain electrode 137d1 may be formed on both sides of a first initialization channel 131d1, and a second initialization source electrode 136d2 and a second initialization drain electrode 137d2 may be formed on both sides of a second initialization channel 131d2. An operation control source electrode 136e and an operation control drain electrode 137e may be formed on both sides of the operation control channel 131e and a light emission control source electrode 136f and a light emission control drain electrode 137f may be formed on both sides of the light emission control channel 131f.

A first insulating layer 141 covering the semiconductor 130 may be formed on semiconductor 130. On the first insulating layer 141 of the pixel unit P, first gate metal lines 121, 122, 123, 128, 155a, 155b, 155c1, 155c2, 155d1, 155d2, 155e, and 155f which may include a scan line 121 including a switching gate electrode 155b, a first compensation gate electrode 155c1, and a second compensation gate electrode 155c2, a previous scan line 122 including a first initialization gate electrode 155d1 and a second initialization gate electrode 155d2, a light emission control line 123 including an operation control gate electrode 155e and a light emission control gate electrode 155f, a bypass control line 128 including the bypass gate electrode 155g, and a driving gate electrode (first storage electrode) 155a may be formed.

A plurality of fanout lines 129 may be formed on the first insulating layer 141 of the peripheral unit S. The fanout lines 129 may be formed of the same material as the first gate metal lines 121, 122, 123, 128, 155a, 155b, 155c1, 155c2, 155d1, 155d2, 155e, and 155f.

A second insulating layer 142 covering the first gate metal lines, the fanout lines, and the first insulating layer may be formed on the first gate metal lines 121, 122, 123, 128, 155a, 155b, 155c1, 155c2, 155d1, 155d2, 155e, and 155f, the fanout lines 129, and the first insulating layer 141. The first insulating layer 141 and the second insulating layer 142 may be made of nitride silicon ($SiN_x$) or silicon oxygen ($SiO_2$).

On the second insulating layer 142 of the pixel unit P, second gate metal lines 126 and 156 including a storage line 126 disposed to be parallel to the scan line 121 and a second storage electrode 156 which is a portion extended from the storage line 126 may be formed.

The etching prevention member 29 may be formed on the second insulating layer 142 of the peripheral unit S. The etching prevention member 29 may be made of the same material as the second gate metal lines 126 and 156.

A third insulating layer 160 may be formed on the second insulating layer 142, the second gate lines 126 and 156, and the etching prevention member 29.

The third insulating layer 160 may include a third inorganic insulating layer 161 contacting the second insulating layer 142 and a third organic insulating layer 162 covering the third inorganic insulating layer 161. The third inorganic insulating layer 161 may be formed as an inorganic layer such as nitride silicon ($SiN_x$) or silicon oxygen ($SiO_2$) and the third organic insulating layer 162 may be formed as an organic layer.

The third insulating layer may be formed by a double layer of the third inorganic insulating layer and the third organic layer to minimize a thin film stress of the third insulating layer and increase a thickness of the third insulating layer. Accordingly, the thickness of the third insulating layer formed between the second gate metal line and the data metal line may be increased, and a parasitic capacitance may be minimized.

The third organic insulating layer may be formed by a coating process or an applying process which is not a depositing process, and the thickness may be controlled. The third insulating layer may be formed by the double layer of the third organic insulating layer and the third inorganic insulating layer to decrease a dielectric constant to 3 or less, and the parasitic capacitance may be minimized. Since the third organic insulating layer may minimize generation of a crack during bending, the third organic insulating layer may be beneficial in the bending as compared with the first insulating layer, the second insulating layer, and the third inorganic insulating layer.

Contact holes 61, 62, 63, 64, 66, and 69 may be formed in the third insulating layer 160 of the pixel unit P. Since the third inorganic insulating layer 161 and the third organic insulating layer 162 forming the third insulating layer 160 may be integrally etched to form the contact holes 61, 62, 63, 64, 66, and 69, inorganic contact holes 61a, 62a, 63a, 64a, 66a, and 69a formed in the third inorganic insulating layer 161 and organic contact holes 61b, 62b, 63b, 64b, 66b, and 69b formed in the third organic insulating layer 162 may have the same boundary line and contact each other.

A sealing groove 160a for improving adhesion between the pixel substrate 100 and the sealing substrate 200 by increasing a contact area of a sealant 310 may be formed on the third insulating layer 160 of the peripheral unit S. In FIG. 9, the sealing groove 160a exposes the etching prevention member 29, but when the third insulating layer 160 is overetched by integral etching, in order to illustrate that the etching prevention member 29 prevents the etching of the second insulating layer 142, the sealing groove 160a may not expose the etching prevention member 29.

Data metal lines 171, 172, 174, 175, and 179 which may include a data line 171, a driving voltage line 172, a first data connection member 174, a second data connection member 175, and a third data connection member 179 may be formed on the third insulating layer 160 of the pixel unit P.

The data line 171 may be connected with the switching source electrode 136b through the contact hole 62 formed in the first insulating layer 141, the second insulating layer 142, and the third insulating layer 160, one end of the first data connection member 174 may be connected with the first storage electrode 155a through the contact hole 61 formed in the second insulating layer 142 and the third insulating layer 160, and the other end of the first data connection member 174 may be connected with the second compensation drain electrode 137c2 and the second initialization drain electrode 137d2 through a contact hole 63 formed in the first insulating layer 141, the second insulating layer 142, and the third insulating layer 160.

A quadrangular second data connection member 175 may be connected with the first initialization source electrode 136d1 through a contact hole 64 formed in the first insulating layer 141, the second insulating layer 142, and the third insulating layer 160. A quadrangular third data connection member 179 may be connected with the light emission control drain electrode 137f through a contact hole 66 formed in the first insulating layer 141, the second insulating layer 142, and the third insulating layer 160.

The peripheral potential voltage line 410 may be formed on the third insulating layer 160 of the peripheral unit S.

Since the etching prevention member 29 is formed on the second insulating layer 142 at a position corresponding to the sealing groove 160a, in an etching process of the third insulating layer 160 for forming the sealing groove 160a, even when the third insulating layer 160 is overetched, the fanout line 129 that may overlap with the peripheral potential voltage line 410 may be prevented from being disconnected from the peripheral potential voltage line 410.

A passivation layer 180 covering the data metal lines, the etching prevention member, and the third insulating layer may be formed on the data metal lines 171, 172, 174, 175, and 179, the etching prevention member 29, and the third insulating layer 160. The passivation layer 180 may be formed by an organic layer.

The pixel electrode 191 and the initialization voltage line 192 may be formed on the passivation layer 180 of the pixel unit P. The third data connection member 179 may be connected with the pixel electrode 191 through a contact hole 81 formed on the passivation layer 180 and the second data connection member 175 may be connected with the initialization voltage line 192 through a contact hole 82 formed on the passivation layer 180.

A pixel defined layer (PDL) 350 covering the passivation layer 180, the initialization voltage line 192, and the pixel electrode 191 may be formed on edges of the passivation layer 180, the initialization voltage line 192, and the pixel electrode 191 and the pixel defined layer 350 may have a pixel opening 351 that exposes the pixel electrode 191. The pixel defined layer 350 may be made of resins such as polyacrylates resin and polyimides or silica-series inorganic materials.

An organic emission layer 370 may be formed on the pixel electrode 191 exposed by the pixel opening 351 and a common electrode 270 may be formed on the organic emission layer 370. The common electrode 270 may be formed on the pixel defined layer 350 to be formed through the plurality of pixels. An organic light emitting diode OLED may be formed, which may include the pixel electrode 191, the organic emission layer 370, and the common electrode 270.

Herein, the pixel electrode 191 may be an anode which may be a hole injection electrode and the common electrode 270 may be a cathode which may be an electron injection electrode. In an embodiment, the pixel electrode 191 may be the cathode and the common electrode 270 may be the anode according to a driving method of the organic light emitting diode display device. When holes and electrons are injected into the organic emission layer 370 from the pixel electrode 191 and the common electrode 270, respectively, and excitons acquired by combining the injected holes and electrons fall from an excitation state to a ground state, light may be emitted.

The organic emission layer 370 may be made of a low-molecular organic material or a high-molecular organic material such as poly 3,4-ethylenedioxythiophene (PEDOT). The organic emission layer 370 may be formed by multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer may be disposed on the pixel electrode 191 which may be the positive electrode, and the hole transporting layer, the emission layer, the electron transporting layer, and the electron injection layer may be sequentially laminated thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer may be formed at a red pixel, a green pixel, and a blue pixel, respectively to implement color images.

In the organic emission layer 370, all of the red organic emission layer, the green organic emission layer, and the blue organic emission layer may together be laminated on the red pixel, the green pixel, and the blue pixel and a red color filter, a green color filter, and a blue color filter may be formed for each pixel to implement the color images. As another example, a white organic emission layer emitting a white light may be formed on all of the red pixel, the green pixel, and the blue pixel and the red color filter, the green color filter, and the blue color filter may be formed for each pixel to implement the color images. When the color images are implemented by using the white organic emission layer and the color filters, a deposition mask for depositing the red organic emission layer, the green organic emission layer, and the blue organic emission layer on individual pixels, for example, the red pixel, the green pixel, and the blue pixel, respectively may not be used.

The white organic emission layer described in another example may be formed by one organic emission layer and may include a configuration that may emit white light by laminating a plurality of organic emission layers. As an example, the white organic emission layer may include a configuration that may enable the white light to be emitted by combining at least one yellow organic emission layer and at least one blue organic emission layer, a configuration that may enable the white light to be emitted by combining at least one cyan organic emission layer and at least one red organic emission layer, or a configuration that may enable the white light to be emitted by combining at least one magenta organic emission layer and at least one green organic emission layer.

The sealing substrate 200 that may protect the organic light emitting diode OLED may be positioned on the common electrode 270. The sealing substrate 200 may be made of various materials including glass, crystal, ceramic, plastic, and metal. A sealant 310 for sealing between the pixel substrate 100 and the sealing substrate 200 may be positioned between the peripheral unit S of the pixel substrate 100 and the sealing substrate 200.

Hereinafter, a manufacturing method of the organic light emitting diode display device according to the exemplary embodiment of the present disclosure will be described in detail with reference to drawings.

Figure 10:
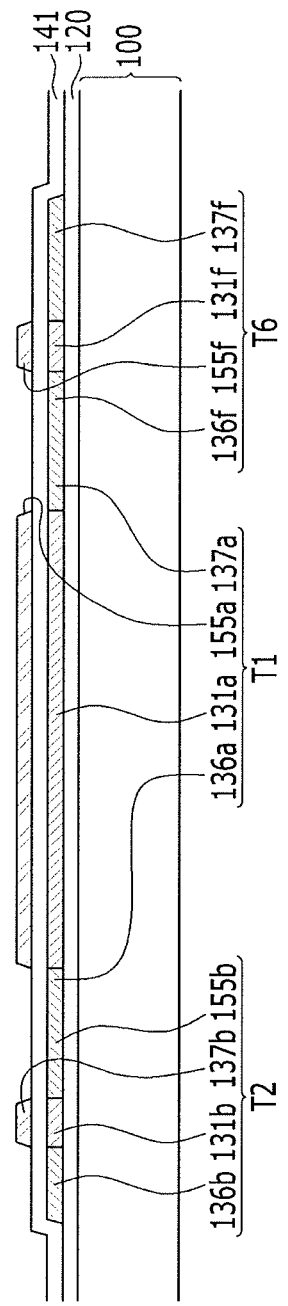
FIG. 10 illustrates a cross-sectional view of forming a first gate line, as a cross-sectional view of the pixel unit in the organic light emitting diode display device according to the exemplary embodiment of the present disclosure.
Figure 11:
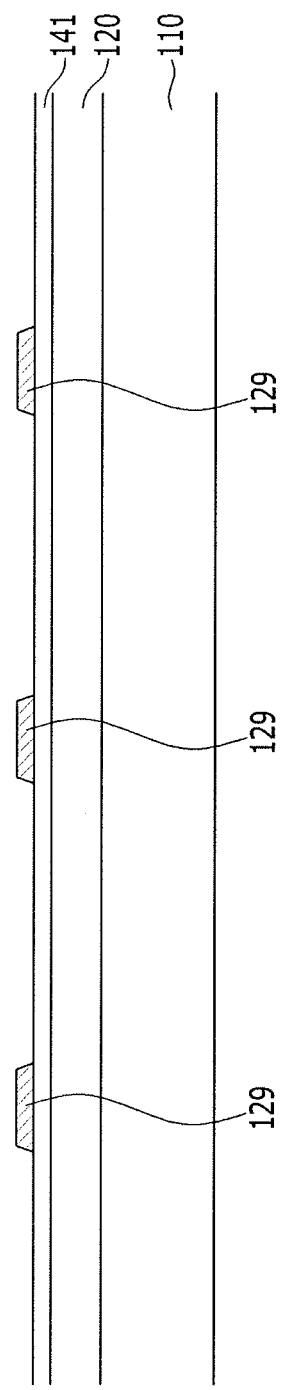
FIG. 11 illustrates a cross-sectional view of forming a fan out unit, as a cross-sectional view of the peripheral unit in the organic light emitting diode display device according to the exemplary embodiment of the present disclosure.
Figure 12:
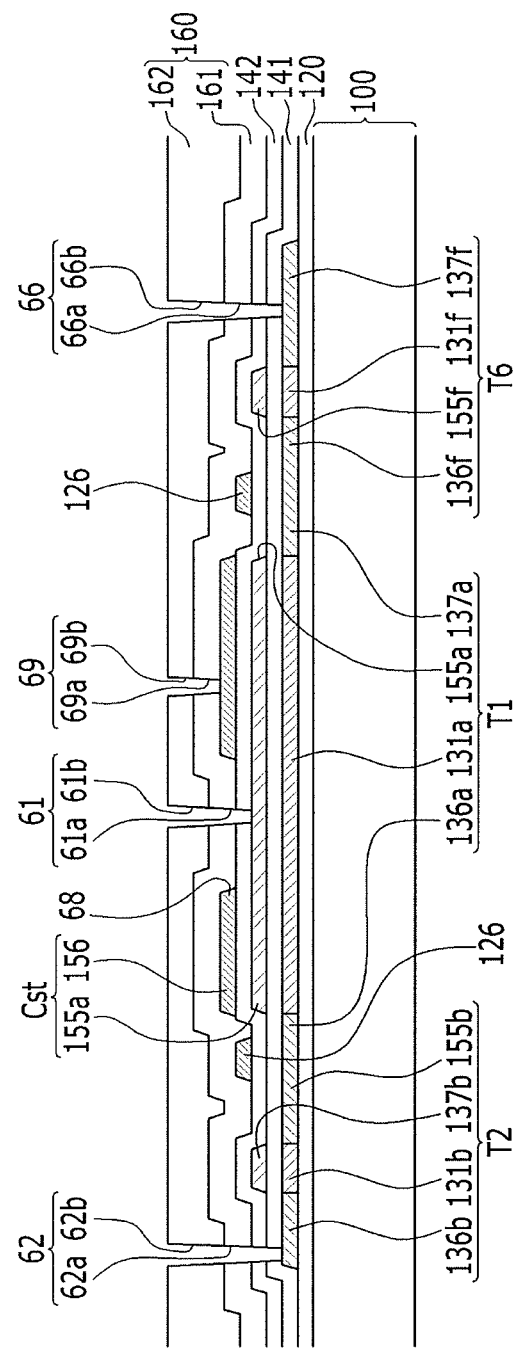
FIG. 12 illustrates a cross-sectional view of forming a contact hole in a third insulating layer as a next step of FIG. 10.
Figure 13:
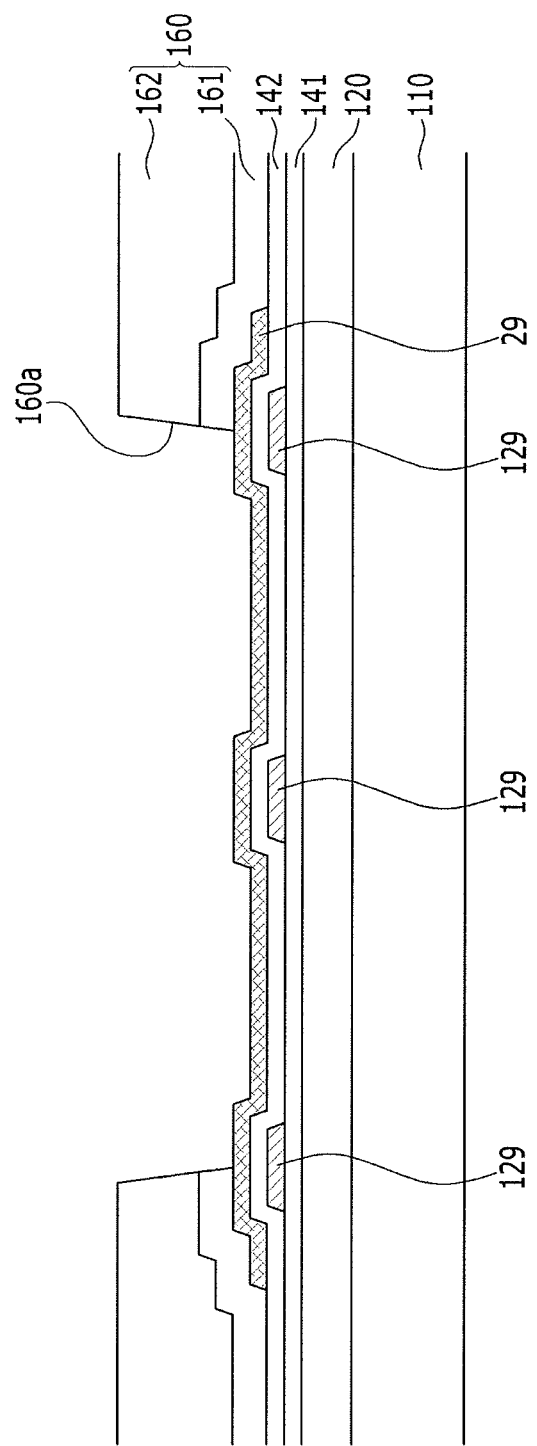
FIG. 13 illustrates a cross-sectional view of forming a sealing groove in the third insulating layer as a next step of FIG. 11.

FIG. 10 illustrates a cross-sectional view of forming a first gate metal line, as a cross-sectional view of the pixel unit in the organic light emitting diode display device according to the exemplary embodiment of the present disclosure, FIG. 11 illustrates a cross-sectional view of forming a fan out unit, as a cross-sectional view of the peripheral unit in the organic light emitting diode display device according to the exemplary embodiment of the present disclosure, FIG. 12 illustrates a cross-sectional view of forming a contact hole in a third insulating layer as a next step of FIG. 10, and FIG. 13 illustrates a cross-sectional view of forming a sealing groove in the third insulating layer as a next step of FIG. 11.

First, as illustrated in FIGS. 10 and 11, the buffer layer 120 may be formed on both the peripheral unit S and the pixel unit P of the pixel substrate 100. The buffer layer 120 may be formed as a single layer of silicon nitride or a laminating layer of silicon nitride and silicon oxide and deposited on the entire surface of the pixel substrate 100 by a method such as plasma enhanced chemical vapor deposition (PECVD). The semiconductor 130 may be formed on the buffer layer 120 of the pixel unit P. The semiconductor 130 may be formed as a polycrystalline semiconductor layer or an oxide semiconductor layer, and the polycrystalline semiconductor layer may be formed by a method of crystallizing an amorphous silicon layer after forming the amorphous silicon layer. As the crystallization method, various known methods may be applied, and for example, the amorphous silicon layer may be crystallized by using heat laser, Joule heat, an electric field, or catalyst metal. On the polycrystalline semiconductor layer, a photolithography process may be performed by using a first mask, and the polycrystalline semiconductor layer may be patterned as the semiconductor 130 having the shape illustrated in FIG. 9. The semiconductor 130 may be not doped, and the semiconductor 130 may not be divided into the semiconductor, the source electrode, and the drain electrode configuring each transistor. The first insulating layer 141 covering the buffer layer 120 and the semiconductor 130 may be formed on the buffer layer 120 and the semiconductor 130. The first insulating layer 141 may be formed by entirely depositing silicon nitride ($SiN_x$) or silicon oxide ($SiO_2$) by a method such as plasma enhanced chemical vapor deposition (PECVD). A first gate metal layer may be deposited on the first insulating layer 141. The first gate metal layer may be formed as a multilayer in which a metal layer including one of copper (Cu), a copper alloy, aluminum (Al), and an aluminum alloy and a metal layer including molybdenum (Mo) and a molybdenum alloy are laminated. The first gate metal layer may be patterned by the photolithography process by using a second mask. As a result, in the pixel unit P, the scan line 121 including the switching gate electrode 155b, the previous scan line 122, the light emission control line 123 including the light emission control gate electrode 155f, the bypass control line 128, and the first gate metal line including the driving gate electrode 155a may be formed, and in the peripheral unit S, a plurality of fanout lines 129 may be formed.

An impurity may be doped on the semiconductor 130. The semiconductor 130 may be doped in the exposed area except for a portion covered by the switching gate electrode 155b, the compensation gate electrode 155c, the initialization gate electrode 155d, the operation control gate electrode 155e, the light emission control gate electrode 155f, the bypass gate electrode 155g, and the driving gate electrode 155a. As a result, the source electrode and the drain electrode of each transistor may be formed. A channel of each transistor may be formed in an area which may be covered by the semiconductor 130 and not doped. For example, the driving channel 131a, the switching channel 131b, the compensation channel 131c, the initialization channel 131d, the operation control channel 131e, the light emission control channel 131f, and the bypass channel 131g may simultaneously be formed. When the semiconductor 130 is doped, a separate mask may not be required.

Next, as illustrated in FIGS. 12 and 13, on the first insulating layer 141, the scan line 121, the previous scan line 122, the light emission control line 123, the bypass control line 128, and the driving gate electrode 155a, the second insulating layer 142 may be formed to cover the first insulating layer 141, the scan line 121, the previous scan line 122, the light emission control line 123, the bypass control line 128, and the driving gate electrode 155a. The second insulating layer 142 may be formed by entirely depositing silicon nitride ($SiN_x$) or silicon oxide ($SiO_2$) by a method such as plasma enhanced chemical vapor deposition (PECVD). The impurity doped on the semiconductor 130 may be positioned well by performing a dopant activation process and damage to an interface between the semiconductor 130 and the first insulating layer 141 may be removed.

A second gate metal layer may be deposited on the second insulating layer 142. The second insulating layer 142 may be formed as a multilayer in which a metal layer including one of copper (Cu), a copper alloy, aluminum (Al), and an aluminum alloy and a metal layer including one of molybdenum (Mo) and a molybdenum alloy are laminated. The second gate metal layer may be patterned through the photolithography process by using the third mask to form the second gate metal line including the storage line 126 and the second storage electrode 156 in the pixel unit P and form the etching prevention member 29 in the peripheral unit S.

On the second insulating layer, the second gate metal line, and the etching prevention member 29, the third insulating layer 160 may be formed to cover the second insulating layer, the second gate metal line, and the etching prevention member 29. The third insulating layer 160 may be formed by laminating the third inorganic insulating layer 161 and the third organic insulating layer 162.

In the pixel unit P, a plurality of contact holes 61, 62, 63, 64, and 66 may be formed in the first insulating layer 141, the second insulating layer 142, and the third insulating layer 160 by patterning the first insulating layer 141, the second insulating layer 142, and the third insulating layer 160 through the photolithography process by using a fourth mask, and in the peripheral unit P, the sealing groove 160a for increasing the contact area of the sealant 310 may be formed on the third insulating layer 160. The contact holes 61, 62, 63, 64, and 66 and the sealing groove 160a may be formed by integrally etching the first insulating layer 141, the second insulating layer 142, and the third insulating layer 160. Since the etching prevention member 29 is formed below the sealing groove 160a, in the case of integrally etching the first insulating layer 141, the second insulating layer 142, and the third insulating layer 160, even when the third insulating layer 160 is overetched, the second insulating layer 142 below the etching prevention member 29 may not be etched. Accordingly, the fanout line 29 covered by the second insulating layer 142 may not be exposed to the outside.

Next, as illustrated in FIGS. 7 to 9, a data metal layer may be formed on the third insulating layer 160. The data metal layer may be formed as a multilayer in which a metal layer including one of copper (Cu), a copper alloy, aluminum (Al), and an aluminum alloy and a metal layer including molybdenum (Mo) and a molybdenum alloy are laminated. For example, the data metal layer may be formed as a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo). The data metal layer may be patterned by the photolithography process using a fifth mask. As a result, data lines which may include a data line 171, a driving voltage line 172, a first data connection member 174, a second data connection member 175, and a third data connection member 179 may be formed on the third insulating layer 160 of the pixel unit P. Simultaneously, the peripheral potential voltage line 410 may be formed on the third insulating layer 160 of the peripheral unit S. The peripheral potential voltage line 410 may overlap with the fanout line 129 and the sealing groove 160a. In the etching process of the third insulating layer 160 for forming the sealing groove 160a, even when the third insulating layer 160 is overetched, the fanout line 129 covered by the second insulating layer 142 may not be exposed to the outside by the etching prevention member 29, and the fanout line 129 that may overlap with the peripheral potential voltage line 410 may be prevented from being disconnected from the peripheral potential voltage line 410.

On the third insulating layer 160, the data line, and the etching prevention member 29, the passivation layer 180 may be formed to cover the third insulating layer 160, the data line, and the etching prevention member 29, and the contact holes 81 and 82 may be formed in the passivation layer 180 through the photolithography process using a sixth mask. A pixel electrode layer may be formed on the passivation layer 180 of the pixel unit P and the passivation layer 180 may be patterned by the photolithography process using a seventh mask to form the pixel electrode 191 connected with the third data connection member 179 through the contact hole 81 and form the initialization voltage line 192 connected with the second data connection member 175 through the contact hole 82.

A pixel defined layer 350 covering the pixel electrode 191 and the initialization voltage line 192 may be formed on the passivation layer 180 and a pixel opening 351 exposing a part of the pixel electrode 191 may be formed in the pixel defined layer 350 by using an eighth mask. The organic emission layer 370 may be formed on the pixel electrode 191 exposed through the pixel opening 351. The common electrode 270 may be formed on the organic emission layer 370 to complete the organic light emitting diode OLED. The sealing substrate 200 may be positioned on the common electrode 270 of the pixel substrate 100 and the sealant 310 may be positioned between the pixel substrate 100 and the sealing substrate 200 to attach the pixel substrate 100 and the sealing substrate 200 to each other.

By way of summation and review, an organic light emitting diode display device may include a plurality of pixels including an organic light emitting diode which may be a self-emission element, and in each pixel, a plurality of transistors for driving the organic light emitting diode and one or more capacitors may be formed. The transistor and the storage capacitor may be configured by a plurality of lines including a gate metal line or a data metal line.

In the case of a high-resolution and large organic light emitting diode display device, in order to solve a signal delay problem, a parasitic capacitance generated when the gate metal line and the data metal line overlap with each other may need to be reduced. A thickness of the insulating layer formed between the gate metal line and the data metal line may be increased, but the insulating layer may be configured by an inorganic layer, and since the inorganic layer may have a large thin film stress, when the thickness of the inorganic layer is large, the inorganic layer may be broken by thin film stress applied from the outside, and there may be a limit to an increase of the thickness of the inorganic layer.

Embodiments may provide an organic light emitting diode display device that may provide a high resolution by minimizing a parasitic capacitance. According to the exemplary embodiment of the present disclosure, by forming a third insulating layer between a second gate metal line and a data metal line as a double layer of a third inorganic insulating layer and a third organic layer, thin film stress of the third insulating layer may be reduced and the thickness of the third insulating layer may be increased, and a parasitic capacitance may be minimized.

By forming the etching prevention member, e.g., layer, between the fanout line and the peripheral potential voltage line, the third insulating layer formed between the second gate metal line and the data metal line as a double layer of the third inorganic insulating layer and the third organic layer may be integrally etched, and manufacturing cost and a manufacturing time may be shortened by reducing the number of masks.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display device, comprising:
   a pixel substrate including a pixel unit displaying an image and a peripheral unit surrounding the pixel unit;
   a first insulating layer covering the pixel substrate;

a fanout line on the first insulating layer of the peripheral unit;

a second insulating layer covering the first insulating layer and the fanout line;

an etching prevention member on the second insulating layer of the peripheral unit and preventing overetching of the second insulating layer;

a third insulating layer covering the second insulating layer;

a peripheral potential voltage line on the third insulating layer of the peripheral unit and transferring a potential voltage;

a passivation layer covering the third insulating layer; and an organic light emitting diode on the passivation layer of the pixel unit, wherein the etching prevention member overlaps with the fanout line and the peripheral potential voltage line.

2. The organic light emitting diode display device as claimed in claim 1, further comprising a sealing groove is on the third insulating layer of the peripheral unit and overlapping the etching prevention member and the fanout line.

3. The organic light emitting diode display device as claimed in claim 1, wherein the third insulating layer includes a third inorganic insulating layer contacting the second insulating layer and a third organic insulating layer covering the third inorganic insulating layer.

4. The organic light emitting diode display device as claimed in claim 3, further comprising a contact hole in the third insulating layer of the pixel unit and including an inorganic contact hole of the third inorganic insulating layer and an organic contact hole of the third organic insulating layer, the inorganic contact hole and the organic contact hole having a same boundary line and contacting each other.

5. The organic light emitting diode display device as claimed in claim 1, further comprising:

a semiconductor on the pixel substrate of the pixel unit;

a first gate metal line on a same layer as the fanout line of the pixel unit;

a second gate metal line on a same layer as the etching prevention member of the pixel unit; and a data metal line on a same layer as the peripheral potential voltage line of the pixel unit.

6. The organic light emitting diode display device as claimed in claim 5, wherein:

the first gate metal line includes a scan line transferring a scan signal, and the data metal line includes a data line and a driving voltage line transferring a data signal and a driving voltage, respectively.

7. The organic light emitting diode display device as claimed in claim 6, wherein:

the semiconductor includes a switching channel of a switching transistor connected with the scan line and the data line and a driving channel of a driving transistor connected with the switching transistor, and the driving channel is curved in a plan view.

8. The organic light emitting diode display device as claimed in claim 7, further comprising:

a storage capacitor including a first storage electrode on the first insulating layer and overlapping the driving channel; and a second storage electrode on the second insulating layer, the second insulating layer covering the first storage electrode and overlapping the first storage electrode, wherein:

the first storage electrode is a driving gate electrode of the driving transistor, and the second gate metal line includes the second storage electrode.

9. The organic light emitting diode display device as claimed in claim 6, wherein the fanout line is connected with the data line and transfers the data signal to the data line from the outside.

10. The organic light emitting diode display device as claimed in claim 6, wherein:

the organic light emitting diode includes a pixel electrode on the passivation layer, an organic emission layer on the pixel electrode, and a common electrode on the organic emission layer, and the peripheral potential voltage line is a peripheral common voltage line transferring a common voltage to the common electrode or a peripheral driving voltage line transferring the driving voltage to the pixel electrode.

11. A manufacturing method of an organic light emitting diode display device, the manufacturing method comprising:

forming a first insulating layer on a pixel substrate including a pixel unit and a peripheral unit;

forming a fanout line on the first insulating layer of the peripheral unit;

forming a second insulating layer on the first insulating layer and the fanout line;

forming an etching prevention member on the second insulating layer of the peripheral unit;

forming a third insulating layer on the second insulating layer and the etching prevention member;

forming a peripheral potential voltage line transferring a potential voltage on the third insulating layer of the peripheral unit;

forming a passivation layer on the third insulating layer; and forming an organic light emitting diode on the passivation layer of the pixel unit, wherein the etching prevention member overlaps with the fanout line and the peripheral potential voltage line.

12. The manufacturing method as claimed in claim 11, further comprising:

forming a sealing groove on the third insulating layer of the peripheral unit, wherein the sealing groove overlaps the etching prevention member and the fanout line.

13. The manufacturing method as claimed in claim 12, wherein:

the third insulating layer includes a third inorganic insulating layer contacting the second insulating layer and a third organic insulating layer covering the third inorganic insulating layer, and forming of the sealing groove includes forming a contact hole in the third insulating layer by integrally etching the third inorganic insulating layer and the third organic insulating layer.

* * * * *